United States Patent
Chan et al.

(10) Patent No.: US 6,856,557 B2
(45) Date of Patent: Feb. 15, 2005

(54) SIGNAL INTEGRITY CHECKING CIRCUIT

(75) Inventors: Johnny Chan, Fremont, CA (US); Jinshu Son, Saratoga, CA (US); Ken Kun Ye, Fremont, CA (US); Tinwai Wong, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/452,562

(22) Filed: May 30, 2003

(65) Prior Publication Data
US 2004/0240280 A1 Dec. 2, 2004

(51) Int. Cl.$^7$ .............................................. G11C 11/34
(52) U.S. Cl. ...................................... 365/190; 365/233
(58) Field of Search .................................. 365/190, 233

(56) References Cited

U.S. PATENT DOCUMENTS 6,218,982 B1 * 4/2001 Shirai et al. ................. 342/118
6,584,536 B1 * 6/2003 Deng ........................... 710/310

* cited by examiner

Primary Examiner—M. Tran
(74) Attorney, Agent, or Firm—Schneck & Schneck; Thomas Schneck; Mark Protsik

(57) ABSTRACT

A signal integrity checking circuit for an integrated circuit detects whether signal condition involving loading of data into storage elements is valid or improper and flags the result. The integrity circuit includes a plurality of adjacently positioned and substantially similar storage elements, which are clocked by a common clock line and loaded from a common data input line. A common reset line may also be provided. The storage elements may be flip-flops, latches, RAM, etc. A logic gate, such as a NAND gate, receives the storage element outputs and flags improper loading of data. Inverters on the input and output sides of one storage element force it to the opposite state from the other storage element. The signal integrity checking circuit is valuable for ensuring proper loading during power-on or start-up, and at other times when loading of data may occur.

9 Claims, 1 Drawing Sheet

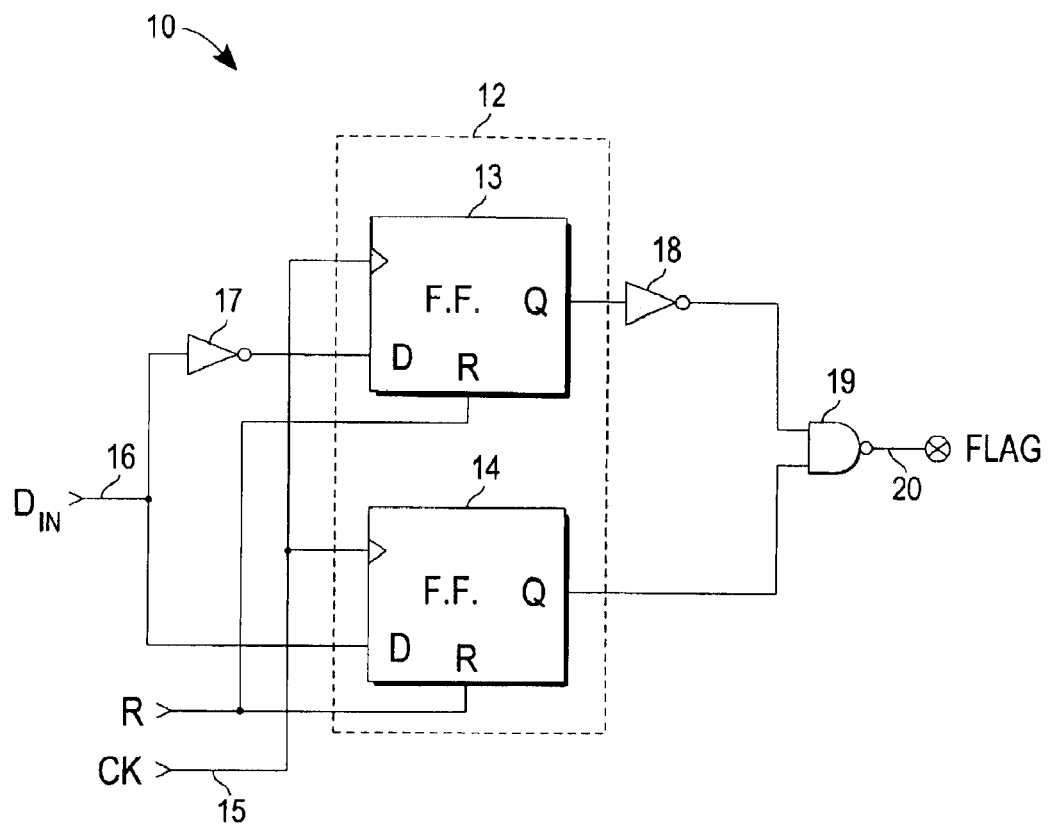
FIGURE

SIGNAL INTEGRITY CHECKING CIRCUIT

TECHNICAL FIELD

The present invention relates to signal integrity monitoring within integrated circuits, for example during power-on or start-up, and also at other times during the devices' operation, and in particular relates to circuits for verifying valid loading of data storage elements and detecting any errors or glitches in such loading.

BACKGROUND ART

Many integrated circuits include flip-flops or other data storage elements to help carry out various sequential logic functions. It is important for correct functional operation of these circuits that storage elements be loaded properly. Poor signal integrity can affect loading of storage elements so that incorrect data may be stored. Therefore, it is desirable that signal integrity be monitored for any problems.

One time period when monitoring of signal integrity is important, for example, is when the power to an integrated circuit is first turned on, since it is critical for proper operation of a circuit that the storage elements be correctly loaded in order to assume a specified initial state. If there is a problem in the start-up conditions, it is possible that incorrect data may stored and the flip-flops may start out in the wrong state, which might cause errors in device operation. It is often during this particular power-up period, when the signal integrity may be most susceptible to problems, since signal lines will not necessarily have yet attained normal voltage levels. Of course, signal integrity is also important at other times during device operation to assure proper loading of the circuit's storage elements.

Signal conditions that might produce errors include noise or fluctuation on any of the clock and reset signal lines, on the data input lines, or on the power supply voltage line. Such conditions may cause the storage elements to load prematurely before the data inputs have reached their proper voltage levels, for example while the power supply lines are still powering up. A noisy reset signal line might cause the storage elements to reload after the data inputs have assumed a different signal level after the loading is supposed to have been completed. Fluctuations on the data input lines from which the flip-flops are to be loaded, resulting in signals that are not clearly in their correct logic state.

It is often difficult to know whether data has been loaded correctly, since functional errors in device operation can sometimes be rather subtle. It is desirable to be able to detect problems with signal integrity, so that if poor load conditions occur, the loading of the data can be repeated.

An objective of the present invention is to provide a signal integrity checking circuit that flags commonly occurring signal integrity problems, including noise or fluctuations on the signal lines, during loading of an integrated circuit's storage elements.

DISCLOSURE OF THE INVENTION

The above objective has been met by a signal integrity checking circuit having a plurality of storage elements, positioned adjacent to each other on the integrated circuit substrate, all of the storage elements being clocked by a common clock signal and all receiving data ($D_{IN}$="1") from a common data input line. The storage element outputs are coupled to a logic gate, preferably a NAND gate, whose output forms the flag output of the integrity circuit. Preferably, one of the storage elements receives and outputs data through a pair of inverters, so that its internal state should be the opposite of the other storage element(s). The storage elements may be flip-flops, latches, RAM, etc.

If there is noise or fluctuations on either the reset line or data input line, causing erroneous loading of data into the storage elements, one or both of the NAND gate inputs will be at a logic "0" signal level, causing the NAND output to become "1", flagging the problem in the load condition.

BRIEF DESCRIPTION OF THE DRAWING

The FIGURE is a plan block circuit diagram of the preferred embodiment of the present invention.

BEST MODE OF CARRYING OUT THE INVENTION

With reference to the Figure, an integrity circuit according to the present invention includes a pair 12 of D flip-flops 13 and 14. These two flip-flops 13 and 14 are laid out on the integrated circuit substrate immediately adjacent to each other. Other types of data storage elements, such as latches or RAM, could be used in place of the flip-flops. The storage elements should be substantially similar in their analog properties. While two flip-flops 13 and 14 are shown in the preferred embodiment, more than two storage elements could be used.

The flip-flops 13 and 14 are clocked together by a common clock signal CK received on a clock input line 15. The data inputs D of the flip-flops 13 and 14 are also coupled to a common data input line 16 from which they receive a data signal $D_{IN}$ to be loaded. The flip-flops 13 and 14 may also receive a common reset signal R, as shown.

The flip-flop outputs Q are coupled to corresponding inputs of a logic NAND gate 19. The output 20 of NAND gate 19 provides a FLAG signal of the integrity circuit 10 that indicates a good signal integrity condition.

One of the flip-flops 13 is indirectly coupled to the data input line 16 through an inverter 17, in which case that flip-flop's output Q is also indirectly coupled to the NAND gate 19 through another inverter 18.

When initial data, $D_{IN}$=1, is correctly loaded into the flip-flops 13 and 14, the flip-flop 13 will have a "0" state and the flip-flop 14 will have a "1" state. If there is any signal fluctuation or noise on any input line sufficient to cause improper loading of data, the flip-flop pair 12 will usually have some other pair of states. All inputs to the NAND gate 19 should be "1"s, so that the FLAG output 20 is at a logic level "0". This would indicate that signal integrity is good, and then the integrated circuit can proceed to the next desired operation. An improper load condition due to poor signal integrity, will usually cause one or more of the NAND inputs to be a logic "0" level, so that the problem will be flagged at the output 20 as FLAG="1".

Note that the pair of inverters 17 and 18 mean that the state of the flip-flop 13 should, if loading of data during start-up proceeds properly, be opposite to that of the flip-flop 14, which does not have such inverters. This can help detect loading errors wherein data fails to be loaded at all. For example, the two flip-flops 13 and 14 should assume the same state upon power-up, since they have identical or substantially similar analog properties, and being adjacently positioned they experience identical natural conditions and are affected similarly.

Once a problem has been flagged at output 20, the system can act to reinitialize the erroneous loading of the integrated circuit flip-flops that are involved in functional operations, on the assumption that one or more of them may also have experienced the same problem as that detected by the integrity checking circuit.

What is claimed is:

1. A signal integrity checking circuit, comprising:
   a plurality of storage elements positioned adjacent to each other on an integrated circuit substrate, each of said storage elements having a clock input, a data input and a data output, the clock inputs of all of said storage elements connected to a common clock signal line, the data inputs of all of said storage elements being coupled to a common data input line for receiving data to be loaded therein such that the storage elements have specified states when properly loaded under a normal signal integrity condition, but one or more of the storage elements assume a state other than their specified state under a poor signal integrity condition; and
   a logic gate having a set of inputs coupled to the data outputs of each of said storage elements and having an output providing a flag signal indicative of a signal integrity condition as an output of the signal integrity checking circuit.

2. The circuit of claim 1 wherein said storage elements are selected from the group consisting of flip-flops, latches, and RAM cells.

3. The circuit of claim 1 wherein each storage element further has a reset input, the reset inputs of all storage elements being connected to a common reset line.

4. A signal integrity checking circuit, comprising:
   a plurality of storage elements positioned adjacent to each other on an integrated circuit substrate, each of said storage elements having a clock input, a data input and a data output, the clock inputs of all of said storage elements connected to a common clock signal line, the data inputs of all of said storage elements being coupled to a common data input line for receiving data to be loaded therein;
   a logic gate having a set of inputs coupled to the data outputs of each of said storage elements and having an output providing a flag signal as an output of the signal integrity checking circuit; and
   a first inverter connected between said data input line and the data input of one of said storage elements, and a second inverter connected between the data output of the same said storage element and an input of the logic gate.

5. A signal integrity checking circuit, comprising:
   a plurality of storage elements positioned adjacent to each other on an integrated circuit substrate, each of said storage elements having a clock input, a data input and a data output, the clock inputs of all of said storage elements connected to a common clock signal line, the data inputs of all of said storage elements being coupled to a common data input line for receiving data to be loaded therein; and
   a logic gate having a set of inputs coupled to the data outputs of each of said storage elements and having an output providing a flag signal as an output of the signal integrity checking circuit;
   wherein said logic gate is a NAND gate, and said initial data has a logic "1" state, said flag signal having a logic "0" state under a normal signal condition but having a logic "1" state in response to a poor signal integrity condition.

6. A signal integrity checking circuit, comprising:
   a pair of flip-flops positioned immediately adjacent to each other on an integrated circuit substrate, both flip-flops having a clock input, a data input and a data output, the clock inputs of both flip-flops connected to a common clock signal line, the data inputs of both flip-flops being coupled to a common data input line for receiving data to be loaded therein such that both flip-flops have specified states when properly loaded under a normal signal integrity condition, but at least one of the flip-flops assumes a state other than its specified state under a poor signal integrity condition; and
   a logic gate having a pair inputs coupled to the data outputs of both flip-flops and having an output providing a flag signal indicative of a signal integrity condition as an output of the signal integrity checking circuit.

7. A signal integrity checking circuit, comprising:
   a pair of flip-flops positioned immediately adjacent to each other on an integrated circuit substrate, both flip-flops having a clock input, a data input and a data output, the clock inputs of both flip-flops connected to a common clock signal line, the data inputs of both flip-flops being coupled to a common data input line for receiving data to be loaded therein;
   a logic gate having a pair inputs coupled to the data outputs of both flip-flops and having an output providing a flat signal as an output of the signal integrity checking circuit; and
   a first inverter connected between said data input line and the data input of one of said flip-flops, and a second inverter connected between the data output of the same said flip-flop and an input of the logic gate.

8. The circuit of claim 6 wherein each flip-flop further includes a reset input, the reset inputs of both flip-flops being connected to common reset line.

9. A signal integrity checking circuit, comprising:
   a pair of flip-flops positioned immediately adjacent to each other on an integrated circuit substrate, both flip-flops having a clock input, a data input and a data output, the clock inputs of both flip-flops connected to a common clock signal line, the data inputs of both flip-flops being coupled to a common data input line for receiving data to be loaded therein; and
   a logic gate having a pair inputs coupled to the data outputs of both flip-flops and having an output providing a flag signal as an output of the signal integrity checking circuit;
   wherein said logic gate is a NAND gate, and said initial data has a logic "1" state, said flag signal having a logic "0" state under a normal signal condition but having a logic "1" state in response to a poor signal integrity condition.

* * * * *